US008890742B2

(12) United States Patent
Chou et al.

(10) Patent No.: US 8,890,742 B2
(45) Date of Patent: Nov. 18, 2014

(54) COLUMN ANALOG-TO-DIGITAL CONVERTER FOR CMOS SENSOR

(71) Applicant: Taiwan Semiconductor Manufacturing Co., Ltd., Hsin-Chu (TW)

(72) Inventors: Kuo-Yu Chou, Hsinchu (TW); Shang-Fu Yeh, Hsin Chu (TW); Erik Tao, Hsinchu (TW); Calvin Yi-Ping Chao, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/792,262

(22) Filed: Mar. 11, 2013

(65) Prior Publication Data

US 2014/0252202 A1    Sep. 11, 2014

(51) Int. Cl.
*H03M 1/56* (2006.01)
*H03M 1/12* (2006.01)
*H04N 5/335* (2011.01)

(52) U.S. Cl.
CPC ............. *H03M 1/12* (2013.01); *H04N 5/3355* (2013.01); *H03M 1/56* (2013.01)
USPC .......................................... 341/169; 341/155

(58) Field of Classification Search
CPC ...... H03M 1/0658; H03M 1/56; H04N 5/374; H04N 5/3745; H04N 5/378

USPC ......................................... 341/129, 156, 169
See application file for complete search history.

(56) References Cited

U.S. PATENT DOCUMENTS

| 7,554,479 | B2 * | 6/2009 | Lim .............................. 341/169 |
| 7,804,438 | B2 * | 9/2010 | Krymski ....................... 341/167 |
| 8,334,913 | B2 * | 12/2012 | Sakurai et al. ................ 348/241 |
| 8,482,447 | B2 * | 7/2013 | Hwang et al. ................. 341/169 |
| 8,773,552 | B2 * | 7/2014 | Egawa .......................... 348/308 |
| 2011/0074994 | A1 | 3/2011 | Wakabayashi et al. |
| 2012/0006974 | A1 * | 1/2012 | Egawa ....................... 250/208.1 |

FOREIGN PATENT DOCUMENTS

JP          2002232291 A  *  8/2002  ............. H03M 1/34

OTHER PUBLICATIONS

Machine Translation of JP 2002-232291.*

* cited by examiner

*Primary Examiner* — Howard Williams
(74) *Attorney, Agent, or Firm* — Duane Morris LLP

(57) ABSTRACT

A system and method is disclosed for an imaging device and/or an analog to digital converter which converts an analog input signal to a digital data signal using a comparator which compares the analog input signal to a first ramped reference signal to determine an operating point and then uses the same comparator to compare the analog input signal to a second ramped reference signal multiple times about the determined operating point.

20 Claims, 7 Drawing Sheets

COLUMN ANALOG-TO-DIGITAL CONVERTER FOR CMOS SENSOR

BACKGROUND

Many imaging devices, such as solid state imaging devices including, but not limited to, complementary metal-oxide semiconductor ("CMOS") devices, charge coupled devices ("CCD") require the implementation of an analog-to-digital converter ("ADC"). The imaging device typically has one or more pixels, such as a two-dimensional array of pixels, where each pixel generates an analog output signal (the "pixel output signal") the level of which is not known. The pixel output signal is typically converted, as necessary, into digital data. In a typical imaging device having a pixel array, where the pixel array is a matrix organized in columns and rows, each column typically has associated therewith a column ADC to convert the pixel output signal then active in that given column to digital data.

As is known in the art, in certain imaging devices the pixel output signal, which may be a voltage signal, is typically compared with a ramped reference signal, which also may be a voltage signal. During this comparison, a counter operates to keep track of the number of pulses of a clock signal required for the ramped reference signal to become greater than (or less than, depending on the particular implementation) than the pixel output signal. From the operation of the counter, a digital data signal can be derived.

In certain implementations of the prior art, multiple comparisons of the pixel output signal with the ramped reference signal may be performed to increase the accuracy of the conversion of the analog pixel output signal into digital data. However, performing multiple comparisons typically results in a low frame rate due to the increased amount of time required to perform the multiple comparisons.

Therefore, there is a need for an ADC that increases analog-to-digital conversion performance while minimizing the amount of time required to perform the conversion.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

Figure 1:
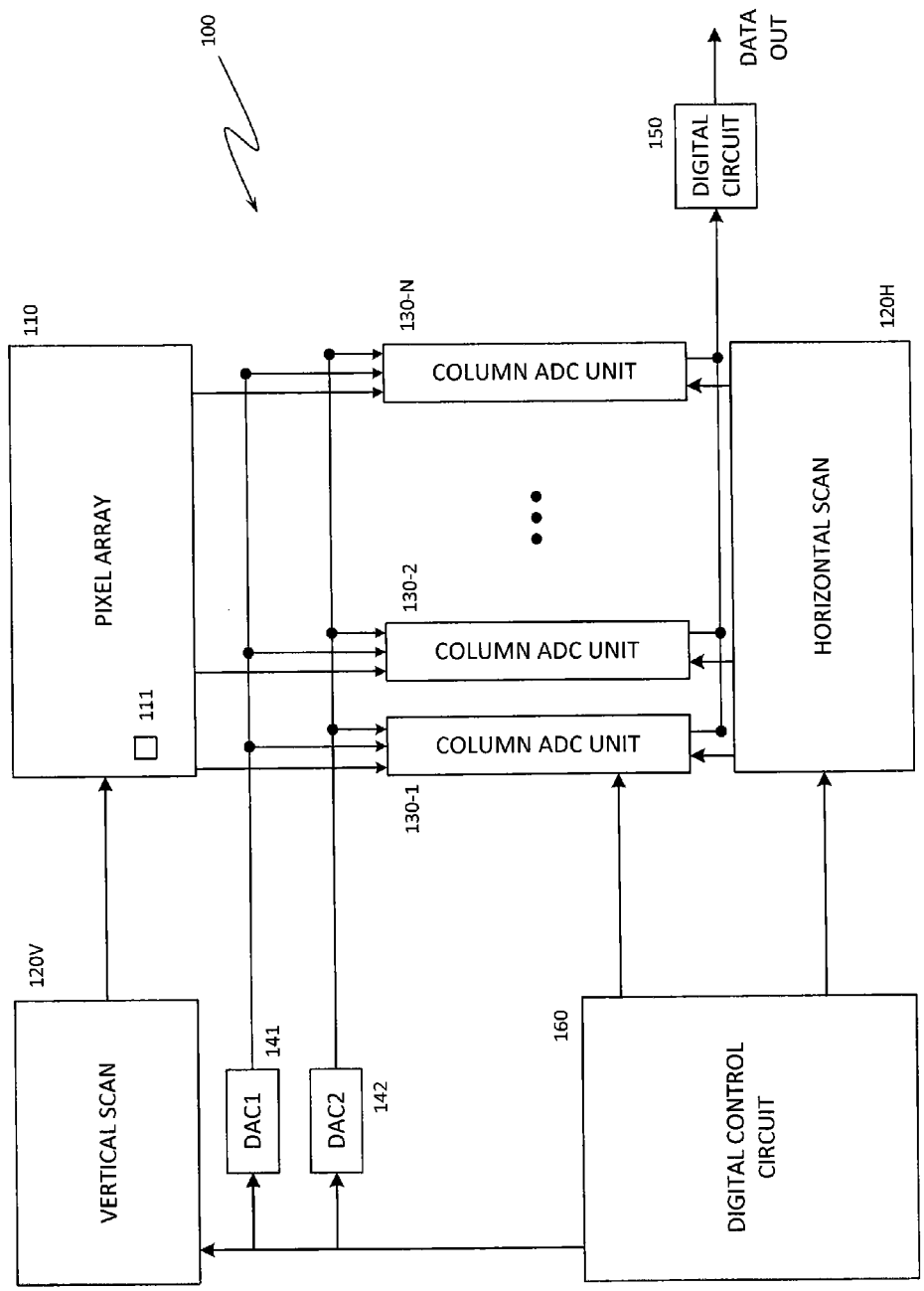
FIG. 1 is a simplified block diagram of an imaging device according to an embodiment of the present subject matter.

With attention drawn to FIG. 1, a simplified block diagram of an imaging device 100 according to an embodiment of the present subject matter is presented. The imaging device includes a pixel array 110 which contains pixel 111, vertical scan device 120V which operates to select a particular row in pixel array 110, and horizontal scan device 120H which operates to select a particular column in pixel array 110, all as are known in the art. Each column of the pixel array 110 has an associated column ADC device, designated 130-1, 130-2, . . . , 130-N, respectively, where "N" equals the number of columns in the pixel array 110. Since each of the column ADC devices operate in the same way, each will be referenced herein as 130.

Each column ADC device 130 receives an analog pixel output signal PIXOUT from a pixel (in its associated column) as selected by the vertical scan device 120V. Further, each column ADC device receives a reference signal from either digital-to-analog converter 141 ("DAC1") or digital-to-analog converter 142 ("DAC2") as will be described in more detail below. The output of the ADC device 130 is supplied to a digital circuit 150 which outputs a digital data signal representative of the analog pixel output signal PIXOUT. Digital control circuit 160 controls the operation of the vertical scan device 120V, the horizontal scan device 120H, each of the column ADCs 130-1 to 130-N (only one control line shown for sake of clarity), and the digital-to-analog converters 141 and 142.

Figure 2:
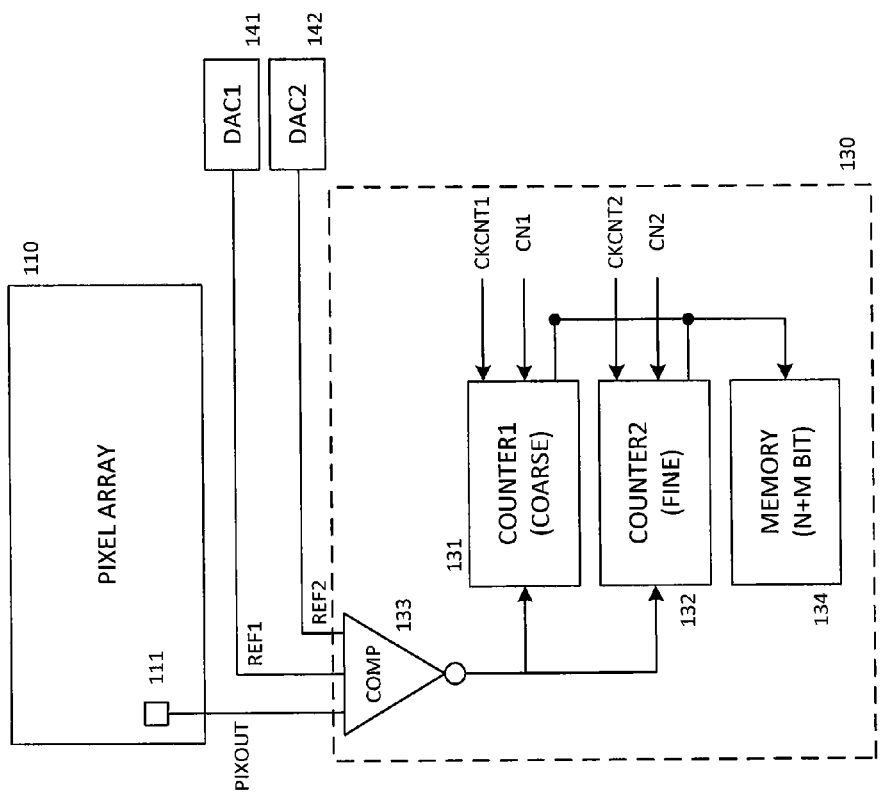
FIG. 2 is a simplified block diagram of a column ADC in FIG. 1 according to an embodiment of the present subject matter.

Considering FIG. 2, shown is a simplified block diagram of column ADC 130 in FIG. 1 according to an embodiment of the present subject matter. ADC 130 includes a comparator 133 which receives a pixel output signal PIXOUT from pixel 111 in pixel array 110, and selectively receives either a first ramped reference signal REF1 from digital-to-analog converter 141 or a second ramped reference signal REF2 from digital-to-analog converter 142. Not shown is a fourth input which is used for balancing the comparator 133. The output of comparator 133 is applied to counter 131 and counter 132. In an embodiment, counter 131 and counter 132 are each bidirectional counters, as is known in the art. Counter 131 also receives a control signal CN1 and a clock count signal CKCNT1. Likewise, counter 132 receives a control signal CN2 and a clock count signal CKCNT2. The output of each of counter 131 and counter 132 is applied to memory device 134.

Generally, in an embodiment, the ADC operates in two steps which may be viewed for convenience as a "coarse" operational step and a "fine" operational step. In the first step, REF1 is applied to comparator 133 so that the pixel output signal PIXOUT is compared to REF1. Additionally, in an embodiment, control signal CN1 enables counter 131 which receives the output of comparator 133. Counter 131 is the counter that is enabled when REF1 is applied to comparator 133. Counter 131 then counts the number of pulses of clock count signal CKCNT1 to find a "coarse conversion operating level" (or "operating point") which occurs when the polarity of the output signal of comparator 133 changes (i.e., "flips"). This occurs when the combined voltage level, i.e., the AC component of REF1 added to the AC component of PIXOUT, when compared to the level of a known voltage level, changes from greater than to less than (or from less than to greater than). The output of counter 131, which may be N bits, is applied to memory device 134. In the second step, REF2 is applied to comparator 133 so that the pixel output signal PIXOUT is compared to REF2. Counter 132 is the counter that is enabled when REF2 is applied to comparator 133. Since from the first step the operating point is known, in an embodiment REF2 ramps multiple times about the operating point. Typically in this embodiment, the range of the REF2 ramps is small when compared to the range of the REF1 ramp. Additionally, in an embodiment, control signal CN2 enables counter 132 which receives the output of comparator 133. Counter 132 counts the number of pulses of clock count signal CKCNT2 for each ramp until the level of REF2 with respect to the level of PIXOUT changes from greater than to less than (or from less than to greater than). The output of counter 132, which may be M bits, is applied to memory device 134.

Figure 3:
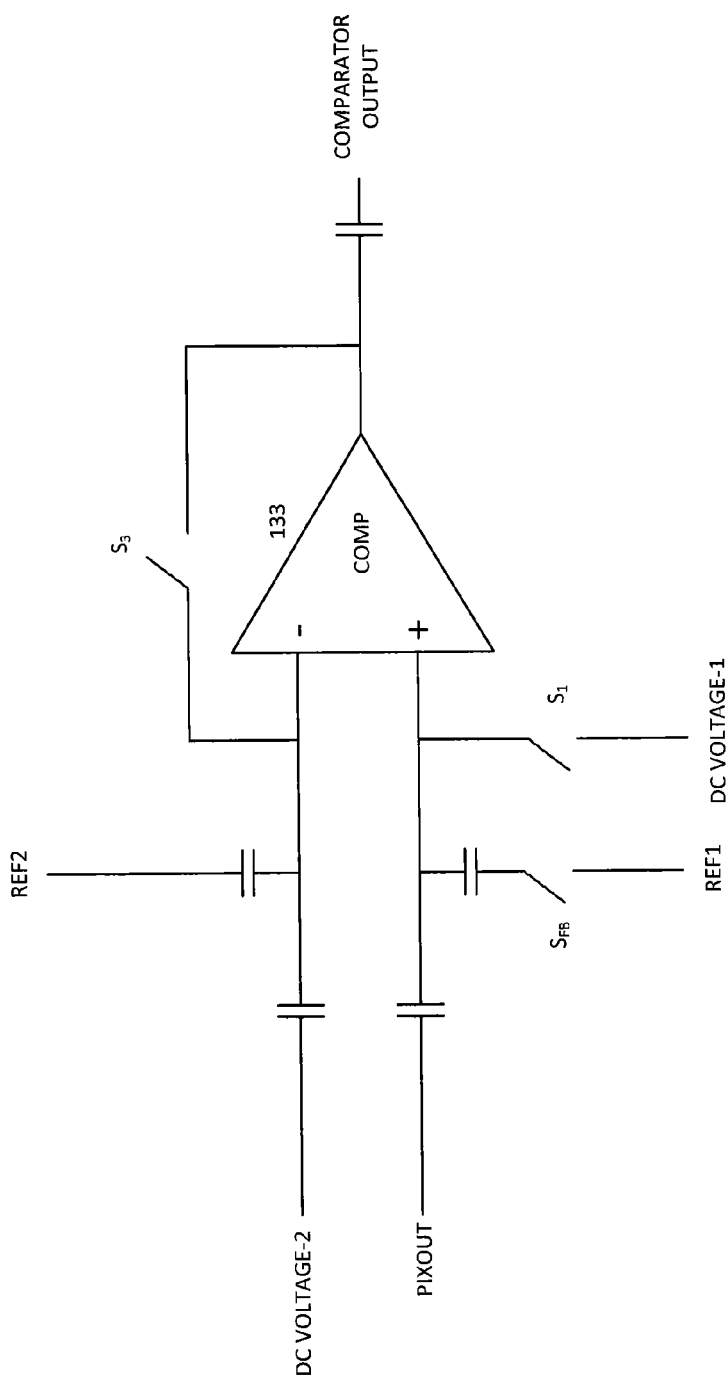
FIG. 3 is a simplified schematic diagram of a portion of the column ADC in FIG. 2 according to an embodiment of the present subject matter.

FIG. 3 is a simplified schematic diagram of a portion of the column ADC in FIG. 2 according to an embodiment of the present subject matter. As discussed herein, comparator 133 receives a pixel output signal PIXOUT and selectively receives a first reference signal REF1, via switch $S_{FB}$, from DAC1 and receives a second reference signal REF2 from DAC2, as discussed in more detail below. The switch $S_3$ is for a feedback loop for the comparator 133. Switch $S_1$ selectively applies/isolates the DC VOLTAGE-1 signal to/from the comparator 133. The capacitors shown are for isolating DC voltage, as is known in the art. Those of skill in the art will readily understand that other switching arrangements that selectively apply one of the two reference signals to comparator 133 are possible and that those other switching arrangements are contemplated herein.

In an embodiment, for the "coarse" operational step pixel output signal PIXOUT and the first reference signal REF1 are applied to one of the terminals of the comparator 133 while the DC VOLTAGE-2 signal, which in an embodiment is zero volts, is applied to the other terminal of comparator 133 shown in FIG. 3. In this instance, switch $S_1$ is open thus isolating comparator 133 from the DC VOLTAGE-1 signal, the REF2 signal is in its initial state, and switch $S_3$ is open. As the REF1 signal ramps, the comparator 133 compares the combined voltage of the PIXOUT and REF1 signals, i.e., the AC component of REF1 added to the AC component of PIXOUT, with the DC VOLTAGE-2 signal, as will be discussed in further detail with respect to FIG. 6.

In an embodiment, for the "fine" operational step pixel output signal PIXOUT is applied to one of the terminals of the comparator 133 while the REF2 signal is applied to the other terminal. The DC VOLTAGE-2 signal, which in an embodiment is zero volts, does not affect the operation of the comparator 133. In this instance, switch $S_1$ is open thus isolating comparator 133 from the DC VOLTAGE-1 signal, switch $S_{FB}$ is open isolating the REF1 signal, and switch $S_3$ is open. As the REF2 signal ramps, the comparator 133 compares the PIXOUT signal with the REF2 signal, as will be discussed in further detail with respect to FIG. 6.

Figure 4:
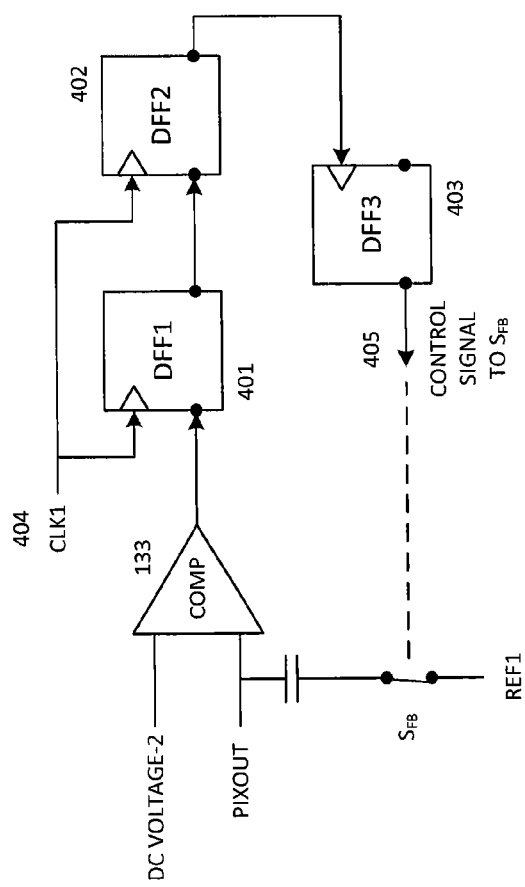
FIG. 4 is a simplified schematic diagram of a feedback switch control circuit in FIG. 3 according to an embodiment of the present subject matter.

FIG. 4 is a simplified schematic diagram of a control circuit for switch $S_{FB}$ shown in FIG. 3, according to an embodiment of the present subject matter. The output of comparator 133 is applied to a first conventional delay flip-flop, DFF1 401, when the transient point of comparator 133 is achieved, i.e., the "operating point" is found, which occurs when the output of comparator 133 switches polarity. DFF1 also receives a clock signal, CLK1 404. The output of DFF1 401 is applied to a second conventional delay flip-flop, DFF2 402. DFF2 also receives the clock signal CLK1 404. The output of DFF2 402 is applied to the clock input of a third conventional delay flip-flop, DFF3. The output of DFF3 is a control signal 405 which operates feedback switch $S_{FB}$. Feedback switch $S_{FB}$ operates as described above for FIG. 3. In a further embodiment, control signal 405 may also control the control signals CN1 and CN2 in FIG. 2.

Due to the delays in introduced by DFF1 and DFF2, DFF3 outputs control signal 405 with two clock cycles of delay. Those of skill in the art will understand that other arrangements of DFF, or similar, devices are contemplated, the operation of which would result in clock cycle delays of one or more clock cycles.

Figure 5:
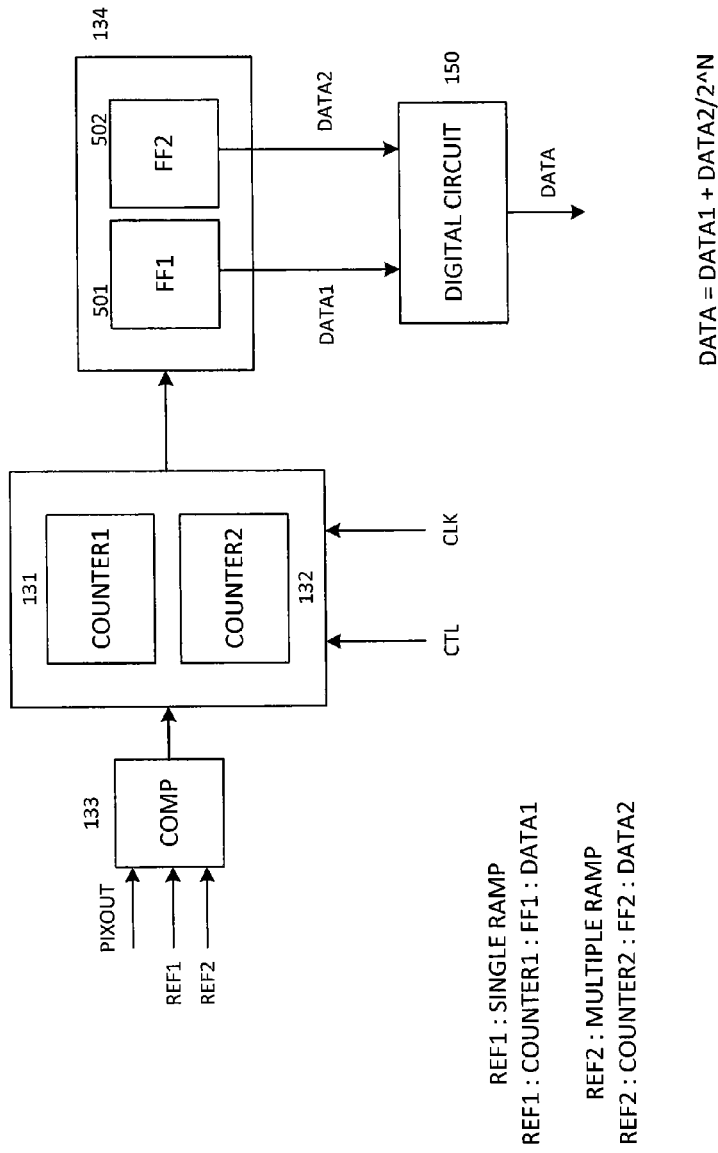
FIG. 5 is a functional block diagram of an imaging device according to another embodiment of the present subject matter.

Now considering FIG. 5, a functional block diagram is presented of an imaging device according to another embodiment of the present subject matter. As described above, the comparator 133 receives a pixel output signal PIXOUT as well as, selectively, reference signals REF1 and REF2. The output of the comparator 133 is applied to counter 131 or counter 132, as described above. Control signal CTL represents the appropriate control signal in FIG. 2, i.e., CN1 (for counter 131) or CN2 (for counter 132). Likewise, clock signal CLK represents the appropriate clock count signal in FIG. 2, i.e., CKCNT1 (for counter 131) or CKCNT2 (for counter 132). As discussed above, the output of counter 131 is applied to the memory device 134 and, in the embodiment shown in FIG. 5, to flip-flop FF1 501. Similarly, the output of counter 132 is applied to the memory device 134 and, in the embodiment shown in FIG. 5, to flip-flop FF2 502.

Thus, FF1 501 contains information related to the comparison of the pixel output signal PIXOUT to reference signal REF1, i.e., the information for the determination of the operating point described above. Correspondingly, FF2 502 contains information related to the comparison of the pixel output signal PIXOUT to reference signal REF2. As explained above, the REF2 ramp signal ramps multiple times about the operating point. In an embodiment, an average of the information for the multiple ramps is used as described below.

The output of FF1 is data signal DATA1, as shown. The output of FF2 is data signal DATA2, as shown. The digital circuit 150 receives the DATA1 and DATA2 signals and combines them to produce a digital data signal DATA which is a digital representation of the analog PIXOUT signal. The digital circuit 150 may use the following equation to determine DATA from DATA1 and DATA2:

$$DATA = DATA1 + \frac{DATA2}{2^N}$$

where $N$ = number of ramp cycles for $REF2$ where a ramp cycle includes a ramp up and a ramp down Additionally, the use of multiple ramps with the REF2 comparisons results in an increase in resolution by (0.5×N) bit; which is $$\frac{10\log 2^N}{6.02}.$$

Figure 6:
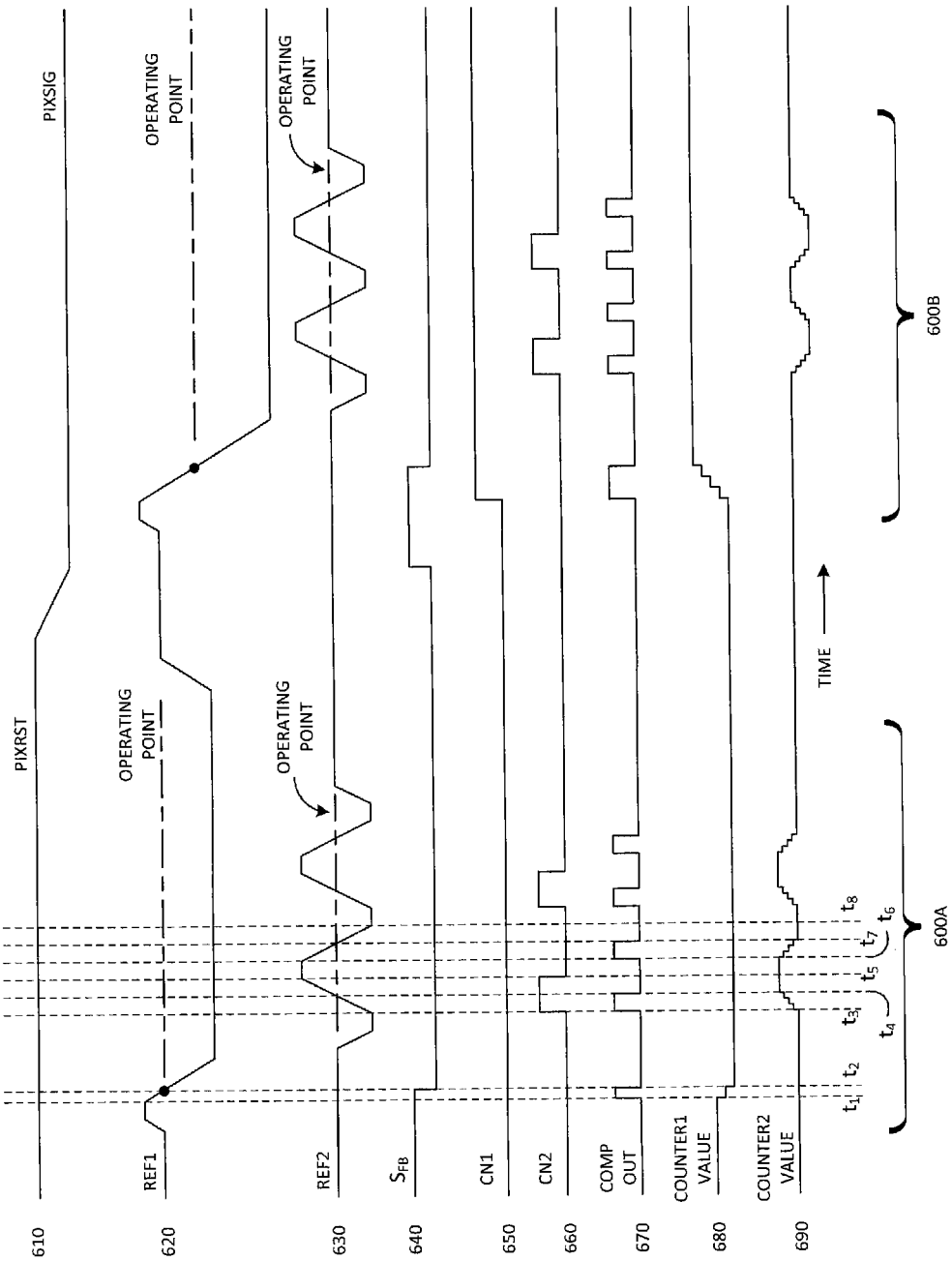
FIG. 6 is a notional timing graph of the operation of a column ADC according to an embodiment of the present subject matter.

With attention now drawn to FIG. 6, a notional timing graph of the operation of a column ADC according to an embodiment of the present subject matter is depicted. The timing graph includes rows 610 through 690, as shown, for various signals which will be described below. Time runs from left to right as indicated. The graph is not to scale.

As is known in the art, an ADC receiving a pixel output signal PIXOUT breaks the PIXOUT signal into two parts and converts each part separately into digital data. The two parts of the PIXOUT signal are referred to as a pixel reset signal, shown in FIG. 6 as PIXRST and a pixel signal, shown in FIG. 6 as PIXSIG. These signals are shown in row 610 of FIG. 6 with the PIXRST portion of the timing graph on the left hand side of FIG. 6 (designated generally 600A) and the PIXSIG portion of the timing graph on the right hand side of FIG. 6 (designated generally 600B).

Row 620 shows the ramp reference signal REF1, which, in an embodiment, is output from DAC1 in FIG. 2. In the 600A portion, the dotted line indicates the operating point of the PIXRST signal. In the 600B portion, the dotted line indicates the operating point of the PIXSIG signal.

Row 630 shows the ramp reference signal REF2, which, in an embodiment, is output from DAC2 in FIG. 2. As discussed herein, the REF2 signal includes plural ramps, as shown. As will be readily understandable to those of skill in the art, the present disclosure is not limited to the number of ramp cycles of REF2 shown in FIG. 6. In the 600A portion, the dotted line indicates the operating point of the PIXRST signal. In the 600B portion, the dotted line indicates the operating point of the PIXSIG signal.

Row 640 indicates the position of the feedback switch $S_{FB}$ shown in FIG. 3. In the embodiment shown in FIG. 6, when $S_{FB}$ is high, reference signal REF1 is applied to a comparator (such as comparator 133 in FIG. 3) for comparison along with the PIXRST or PIXSIG signal, as appropriate, as discussed above. When $S_{FB}$ is low, reference signal REF2 is applied to the same comparator (such as comparator 133 in FIG. 3) for comparison with the PIXRST or PIXSIG signal, as appropriate, as discussed above.

Row 650 depicts control signal CN1 in FIG. 2, for counting either up or down for bidirectional counter 131. As discussed above, when REF1 is applied to the comparator, counter 131 is enabled.

Row 660 depicts control signal CN2 in FIG. 2, for counting either up or down for bidirectional counter 132. As discussed above, when REF2 is applied to the comparator, counter 132 is enabled.

Row 670 depicts the output of the comparator 133 in FIG. 2. When the output of the comparator is high, counting is enabled for the appropriate counter. When the output of the comparator is low, counting stops.

Row 680 depicts the value of COUNTER1, i.e., counter 131 in FIG. 2. Similarly, row 690 depicts the value of COUNTER2, i.e., counter 132 in FIG. 2.

In an embodiment, the operation of an ADC, such as ADC 130 in FIG. 2, according to the timing graph of FIG. 6, is as follows. This discussion will focus on the 600A portion of FIG. 6 (traveling from left to right with time) but is also applicable to the 600B portion of FIG. 6.

In the first phase, at time $t_1$ feedback switch $S_{FB}$ in row 640 is high thus applying the ramping reference signal REF1 (row 620) to the comparator 133 (and therefore counter 131 is enabled). The PIXRST signal is combined with the REF1 signal, i.e., the AC component of REF1 is added to the AC component of PIXRST, as the REF1 signal ramps from a high value at $t_1$. Also at $t_1$, the control signal CN1 is low (row 650) thus causing counter 131 to count, in the down direction, the CKCNT1 signal in FIG. 2. Additionally, the comparator output signal (row 670) is high enabling counter 131 (COUNTER1) to begin counting, as shown in row 680. At time $t_2$, the level of the combined REF1 signal and PIXRST signal, i.e., the AC component of REF1 added to the AC component of PIXRST, causes the comparator 133 to flip which will cause (after a number of clock pulses, in an embodiment) feedback switch $S_{FB}$ in row 640 to go low thus interrupting the REF1 signal from being applied to the comparator 133. Additionally at time $t_2$, the comparator output signal goes low (row 670) ending the counting down operation of counter 131 in row 680. The operating point, as described above, has thus been determined and will be used for the second phase starting at $t_3$.

In the second phase, at time $t_3$ the PIXRST signal is compared with the REF2 signal as the REF2 signal ramps from a low value at $t_3$. Since the operating point is known from the first phase, the REF2 signal will ramp multiple times around the operating point, as shown in FIG. 6. Also at $t_3$, the control signal CN2, goes high thus causing counter 132 to count in the up direction the CKCNT2 signal in FIG. 2. Additionally, the comparator output signal (row 670) goes high enabling counter 132 (COUNTER2) to begin counting, as shown in row 690. At time $t_4$, the level of the REF2 signal ramps past the level of the PIXRST signal thus causing the comparator 133 to flip which will cause the comparator output signal (row 670) to go low thus ending the counting operation of COUNTER2 (row 690).

Continuing with the second phase, at time $t_5$ the REF2 signal (row 630) finishes ramping and the control signal CN2 (row 660) goes low which will thus cause counter 132 (COUNTER2) to count in the down direction when it is next enabled. At time $t_6$, the PIXRST signal is compared with the REF2 signal as the REF2 signal (row 630) ramps from a high value. Also at $t_6$, the comparator output signal (row 670) goes high enabling counter 132 (COUNTER2) to begin counting (in the down direction since CN2 (row 660) is low), as shown in row 690. At time $t_7$, the level of the REF2 signal ramps past the level of the PIXRST signal thus causing the comparator 133 to flip which will cause the comparator output signal (row 670) to go low thus ending the counting operation of COUNTER2 (row 690). At time $t_8$, the REF2 signal (row 630) finishes ramping.

The ramp cycles for REF2 described above from $t_3$ to $t_8$ repeats a predetermined number of times where that predetermined number may be set by operational parameters for the ADC 130. Once the predetermined number of ramp cycles is met, the first and second phase are repeated for the PIXSIG signal where, in the embodiment shown in FIG. 6, the counters count in the opposite direction, as seen by the COUNTER1 VALUE (row 680) and COUNTER2 VALUE (row 690) graphs between the 600A portion and 600B portions of FIG. 6.

Figure 7:
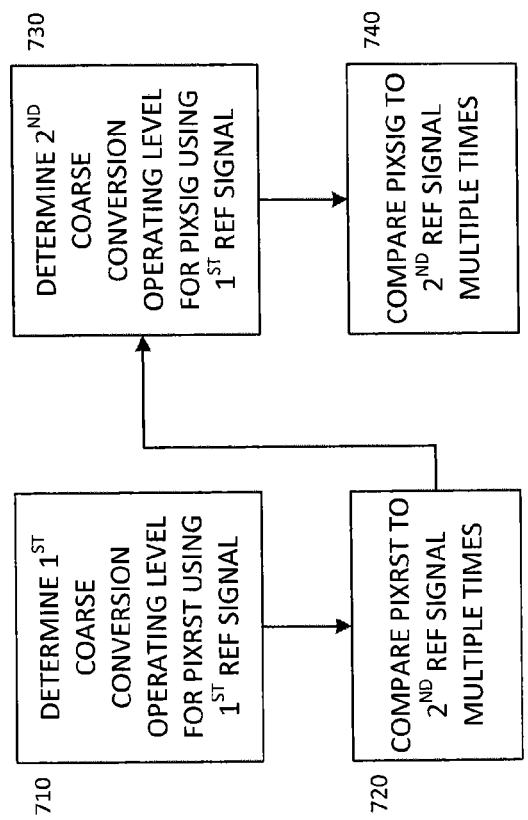
FIG. 7 is a flow diagram of a method for analog-to-digital conversion of a pixel output signal according to an embodiment of the present subject matter.

Now turning to FIG. 7, a flow diagram of a method for analog-to-digital conversion of a pixel output signal according to an embodiment of the present subject matter is presented. At step 710, determine a first coarse conversion operating level using a comparator. The comparator compares a reset level of a pixel output signal with a first reference signal. At step 720, compare the reset level of the pixel output signal with a second reference signal using the comparator where the level of the second reference signal ramps multiple times through the first coarse conversion operating level. At step 730, determine a second coarse conversion operating level using the comparator. The comparator compares a signal level of the pixel output signal with the first reference signal. At step 740, compare the signal level of the pixel output signal with the second reference signal using the comparator where the level of the second reference signal ramps multiple times through the second coarse conversion operating level.

In another embodiment, step 710 utilizes a first counter operating in a first direction (i.e., either down or up). Step 720 utilizes a second counter operating in a second direction (i.e., either up or down) to determine a crossing point between a first ramp segment of the second reference signal and the reset level of the pixel output signal, and utilizes the second counter operating in the first direction (i.e., either down or up) to determine a crossing point between a second ramp segment of the second reference signal and the reset level of the pixel output signal.

In a further embodiment, step 730 utilizes the first counter operating in the second direction. Step 740 utilizes the second counter operating in the first direction to determine a crossing point between a third ramp segment of the second reference signal and the signal level of the pixel output signal, and utilizes the second counter operating in the second direction to determine a crossing point between a fourth ramp segment of the second reference signal and the signal level of the pixel output signal.

A still further embodiment includes algebraically combining the number of counts for the first counter operating in the first direction, the number of counts for the first counter operating in the second direction, and the algebraic average of a number of counts of the second counter for each of the first, second, third, and fourth ramp segments.

In yet a further embodiment, the first reference signal ramps once between a first value and a second value for step 730, the second reference signal ramps plural times between a third value and a fourth value for step 740, and a difference between the first and second values is greater than a difference between the third and fourth values.

In some embodiments, an imaging device includes a first digital to analog converter to provide a first reference signal to a comparator, a second digital to analog converter to provide a second reference signal to said comparator, and a first pixel in a pixel array to provide a pixel output signal to the comparator; the comparator includes an output terminal operatively connected to a first input terminal of a first counter and a first input terminal of a second counter; the first counter includes a second input terminal to receive a first clock counter signal, a third input terminal to receive a first control signal, and a output terminal operatively connected to a memory device; the second counter includes a second input terminal to receive a second clock counter signal, a third input terminal to receive a second control signal, and a output terminal operatively connected to the memory device. In an embodiment, at least one switch is included to selectively provide the first reference signal or the second reference signal to the comparator.

In some embodiments, the first and second reference signals are ramp signals. In some embodiments, the first control signal enables the first counter when the first reference signal is applied to the comparator. In other embodiments, the second control signal enables the second counter when the second reference signal is applied to the comparator. In further embodiments, the at least one switch is operated by a feedback signal based at least in part on a change in polarity between a first output signal of the comparator and a second output signal of the comparator when the first reference signal is provided to the comparator. In still further embodiments, the first and second counters are bidirectional counters.

In some embodiments, an analog to digital converter includes a comparator having a first input terminal to receive a first reference signal, a second input terminal to receive a second reference signal, a third input terminal to receive an operating signal, and an output terminal to provide a comparison signal; a first counter having a first input terminal to receive the comparison signal, a second input terminal to receive a first clock counter signal, a third input terminal to receive a first control signal, and a output terminal to provide a first data signal; a second counter having a first input terminal to receive the comparison signal, a second input terminal to receive a second clock counter signal, a third input terminal to receive a second control signal, and a output terminal to provide a second data signal; and a memory device to store the first and second data signals.

In some embodiments, the analog to digital converter further includes digital circuitry operatively connected to the memory device where the digital circuitry processes the first and second data signals to thereby produce a digital signal representative of the operating signal. In other embodiments, the analog to digital converter further includes circuitry for selectively enabling the first or the second counter. In further embodiments, the analog to digital converter includes circuitry for selectively applying the first reference signal or the second reference signal to the comparator. In still further embodiments, the first control signal enables the first counter when the first reference signal is applied to the comparator. In yet further embodiments, the first and second reference signals are ramp signals.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. An imaging device, comprising:
a first digital to analog converter to provide a first reference signal to a comparator, a second digital to analog converter to provide a second reference signal to said comparator, and a first pixel in a pixel array to provide a pixel output signal to said comparator;
said comparator comprising an output terminal operatively connected to a first input terminal of a first counter and a first input terminal of a second counter;
said first counter comprising a second input terminal to receive a first clock count signal, a third input terminal to receive a first control signal, and a output terminal operatively connected to a memory device; and
said second counter comprising a second input terminal to receive a second clock count signal, a third input terminal to receive a second control signal, and a output terminal operatively connected to said memory device,
wherein the comparator is configured to compare the pixel output signal to the second reference signal that is configured to ramp plural through a coarse conversion operating level.

2. The imaging device of claim 1 wherein said first reference signal is a ramp signal.

3. The imaging device of claim 2 wherein said first control signal enables said first counter when said first reference signal is applied to said comparator.

4. The imaging device of claim 2 wherein said second control signal enables said second counter when said second reference signal is applied to said comparator.

5. The imaging device of claim 1 further comprising a switch to selectively apply said first reference signal wherein said switch is operated by a feedback signal based at least in part on a change in polarity between a first output signal of said comparator and a second output signal of said comparator when said first reference signal is provided to said comparator.

6. The imaging device of claim 1 wherein said first and second counters are bidirectional counters.

7. The analog to digital converter of claim 1 further comprising circuitry for selectively enabling said first or said second counter.

8. The analog to digital converter of claim 1 further comprising circuitry for selectively applying said first reference signal or said second reference signal to said comparator.

9. The analog to digital converter of claim 8 wherein said first control signal enables said first counter when said first reference signal is applied to said comparator.

10. The analog to digital converter of claim 1 wherein said first reference signal is a ramp signal.

11. An analog to digital converter, comprising:
 a comparator comprising a first input terminal to receive a first reference signal, a second input terminal to receive a second reference signal, a third input terminal to receive an operating signal, and an output terminal to provide a comparison signal;
 a first counter comprising a first input terminal to receive the comparison signal, a second input terminal to receive a first clock count signal, a third input terminal to receive a first control signal, and a output terminal to provide a first data signal;
 a second counter comprising a first input terminal to receive the comparison signal, a second input terminal to receive a second clock count signal, a third input terminal to receive a second control signal, and a output terminal to provide a second data signal; and
 a memory device to store the first and second data signals, wherein the comparator is configured to compare the operating signal to the second reference signal that is configured to ramp plural times through a coarse conversion operating level.

12. The analog to digital converter of claim 11 further comprising digital circuitry operatively connected to said memory device wherein said digital circuitry processes the first and second data signals to thereby produce a digital signal representative of the operating signal.

13. A method for analog to digital conversion of a pixel output signal, the method comprising the steps of:
 (a) determining a first coarse conversion operating level using a comparator to compare a reset level of a pixel output signal with a first reference signal;
 (b) comparing the reset level of the pixel output signal with a second reference signal using the comparator wherein the level of the second reference signal ramps plural times through the first coarse conversion operating level;
 (c) determining a second coarse conversion operating level using the comparator to compare a signal level of the pixel output signal with the first reference signal; and
 (d) comparing the signal level of the pixel output signal with the second reference signal using the comparator wherein the level of the second reference signal ramps plural times through the second coarse conversion operating level.

14. The method of claim 13 wherein the first reference signal is a ramp signal.

15. The method of claim 14 wherein step (a) further comprises using a first counter operating in a first direction.

16. The method of claim 15 wherein step (b) further comprises using a second counter operating in a first direction to determine a crossing point between a first ramp segment of the second reference signal and the reset level of the pixel output signal, and using the second counter operating in a second direction to determine a crossing point between a second ramp segment of the second reference signal and the reset level of the pixel output signal.

17. The method of claim 16 wherein step (c) further comprises using the first counter operating in the first direction.

18. The method of claim 17 wherein step (d) further comprises using the second counter operating in the first direction to determine a crossing point between a third ramp segment of the second reference signal and the signal level of the pixel output signal, and using the second counter operating in the second direction to determine a crossing point between a fourth ramp segment of the second reference signal and the signal level of the pixel output signal.

19. The method of claim 18 further comprising the step of algebraically combining a number of counts for the first counter operating in the first direction, a number of counts for the first counter operating in the second direction, and the algebraic average of a number of counts of the second counter for each of the first, second, third, and fourth ramp segments.

20. The method of claim 13 wherein the first reference signal ramps once between a first value and a second value for step (c), the second reference signal ramps plural times between a third value and a fourth value for step (d), and a difference between the first and second values is greater than a difference between the third and fourth values.

\* \* \* \* \*